United States Patent
Shen et al.

(10) Patent No.: US 11,505,457 B2
(45) Date of Patent: Nov. 22, 2022

(54) SEMICONDUCTOR REMOVING APPARATUS AND OPERATION METHOD THEREOF

(71) Applicant: XINTEC INC., Taoyuan (TW)

(72) Inventors: Yu-Tang Shen, New Taipei (TW); Shun-Wen Long, Taoyuan (TW); Chih-Hung Cho, Taoyuan (TW); Hsing-Yuan Chu, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 17/709,932

(22) Filed: Mar. 31, 2022

(65) Prior Publication Data

US 2022/0332571 A1 Oct. 20, 2022

Related U.S. Application Data

(60) Provisional application No. 63/176,121, filed on Apr. 16, 2021.

(51) Int. Cl.
*B32B 43/00* (2006.01)
*B81C 99/00* (2010.01)

(52) U.S. Cl.
CPC ........ *B81C 99/0025* (2013.01); *B32B 43/006* (2013.01); *B81C 2201/056* (2013.01); *Y10T 156/1168* (2015.01); *Y10T 156/1978* (2015.01)

(58) Field of Classification Search
CPC ............. B32B 43/006; Y10T 156/1168; Y10T 156/1978
See application file for complete search history.

(56) References Cited

U.S. PATENT DOCUMENTS

| | | | | |
|---|---|---|---|---|
| 4,631,103 A | * | 12/1986 | Ametani | H01L 21/67132 414/416.01 |
| 5,009,735 A | * | 4/1991 | Ametani | B29C 63/0013 156/716 |
| 5,282,918 A | * | 2/1994 | Heist | G03F 7/161 156/765 |
| 5,466,325 A | * | 11/1995 | Mizuno | G03F 7/42 156/275.5 |
| 6,227,276 B1 | * | 5/2001 | Kim | B29C 63/0013 156/247 |
| 6,503,130 B2 | * | 1/2003 | Lim | B24B 37/34 156/716 |
| 7,798,195 B2 | * | 9/2010 | Kobayashi | H01L 21/6835 156/707 |

(Continued)

*Primary Examiner* — Philip C Tucker
*Assistant Examiner* — Nickolas R Harm
(74) *Attorney, Agent, or Firm* — Liu & Liu

(57) ABSTRACT

An operation method of a semiconductor removing apparatus includes moving a semiconductor structure to a stage, wherein the semiconductor structure includes a lower substrate, a cap, and a micro electro mechanical system (MEMS) structure between the lower substrate and the cap, and the cap has a diced portion; pulling, by a clamp assembly, a tape of a tape roll from a first side of the stage to a second side of the stage opposite to the first side, such that the tape is attached to the cap of the semiconductor structure; and pulling, by the clamp assembly, the tape of the tape roll from the second side of the stage back to the first side of the stage, such that the diced portion of the cap separates from the semiconductor structure.

15 Claims, 9 Drawing Sheets

(56) References Cited

U.S. PATENT DOCUMENTS

| | | | |
|---|---|---|---|
| 2003/0037877 A1* | 2/2003 | Brinkmann | G09F 3/00 |
| | | | 156/701 |
| 2005/0205204 A1* | 9/2005 | Kurosawa | H01L 21/67132 |
| | | | 156/716 |
| 2009/0014124 A1* | 1/2009 | Tsujimoto | H01L 21/67132 |
| | | | 156/759 |
| 2012/0103501 A1* | 5/2012 | Neeper | B29C 63/0013 |
| | | | 156/64 |
| 2017/0158449 A1* | 6/2017 | Kramer | B32B 43/006 |
| 2019/0111612 A1* | 4/2019 | Han | B32B 43/006 |
| 2020/0023630 A1* | 1/2020 | Sigi | H01L 21/67132 |

\* cited by examiner

SEMICONDUCTOR REMOVING APPARATUS AND OPERATION METHOD THEREOF

RELATED APPLICATIONS

This application claims priority to U.S. Provisional Application Ser. No. 63/176,121, filed Apr. 16, 2021, which is herein incorporated by reference.

BACKGROUND

Field of Invention

The present disclosure relates to a semiconductor removing apparatus and an operation method of the semiconductor removing apparatus.

Description of Related Art

For semiconductor structures having accelerators or gyroscopes, a silicon cap (Si cap) is usually disposed on a micro electro mechanical system (MEMS) structure to provide protection and a vacuum environment. During the fabrication of a semiconductor structure, a silicon cap and a MEMS structure may cover the conductive pads of a lower substrate used to bond to other electronic components. Therefore, it is necessary to perform a dicing process and a subsequent removal process on the silicon cap and the MEMS structure above specific conductive pads to form openings for exposing the conductive pads. Typically, the removal process is performed to blow the diced portion of the silicon cap out of the semiconductor structure using an operator's air spray gun.

However, it is difficult for an operator to save the time of removing the diced portion by using the air spray gun, and the diced portion blown out by the air spray gun may injure the operator. In addition, the use of the air spray gun may also cause dust particles to the working environment.

SUMMARY

One aspect of the present disclosure provides semiconductor removing apparatus.

According to some embodiments of the present disclosure, a semiconductor removing apparatus includes a stage, a tape roll movably, and a clamp assembly. The stage is configured to position a semiconductor structure, wherein the semiconductor structure includes a lower substrate, a cap, and a micro electro mechanical system (MEMS) structure between the lower substrate and the cap, and the cap has a diced portion. The tape roll is movably located at a first side of the stage. The clamp assembly is movably located above the stage, and is configured to pull a tape of the tape roll from the first side of the stage to a second side of the stage opposite to the first side such that the tape is attached to the cap of the semiconductor structure. Moreover, the clamp assembly is configured to pull the tape of the tape roll from the second side of the stage back to the first side of the stage such that the diced portion of the cap separates from the semiconductor structure.

In some embodiments, the semiconductor removing apparatus further includes a cutting tool located at the first side of the stage and configured to cut the tape.

In some embodiments, the semiconductor removing apparatus further includes an accommodating box located below the stage and configured to receive the cut tape.

In some embodiments, the semiconductor removing apparatus further includes an inclined board located below the cutting tool and extending toward the accommodating box.

In some embodiments, the semiconductor removing apparatus further includes a motor connected to the tape roll.

In some embodiments, the semiconductor removing apparatus further includes a motor connected to the clamp assembly.

In some embodiments, the semiconductor removing apparatus further includes a roller assembly movably located above the stage and between the tape roll and the clamp assembly.

In some embodiments, the semiconductor removing apparatus further includes a motor connected to the roller assembly.

One aspect of the present disclosure provides an operation method of a semiconductor removing apparatus.

According to some embodiments of the present disclosure, an operation method of a semiconductor removing apparatus includes moving a semiconductor structure to a stage, wherein the semiconductor structure includes a lower substrate, a cap, and a micro electro mechanical system (MEMS) structure between the lower substrate and the cap, and the cap has a diced portion; pulling, by a clamp assembly, a tape of a tape roll from a first side of the stage to a second side of the stage opposite to the first side, such that the tape is attached to the cap of the semiconductor structure; and pulling, by the clamp assembly, the tape from the second side of the stage back to the first side of the stage, such that the diced portion of the cap separates from the semiconductor structure.

In some embodiments, the operation method of the semiconductor removing apparatus further includes: after pulling the tape from the second side of the stage back to the first side of the stage, cutting the tape by a cutting tool.

In some embodiments, the operation method of the semiconductor removing apparatus further includes: after cutting the tape, receiving, by an accommodating box located below the stage, the tape that is cut by the cutting tool.

In some embodiments, the operation method of the semiconductor removing apparatus further includes: using a roller assembly located above the stage to abut against the tape, wherein the roller assembly is located between the tape roll and the clamp assembly.

In some embodiments, wherein using the roller assembly to abut against the tape is performed such that the tape is attached to the semiconductor structure.

In some embodiments, the operation method of the semiconductor removing apparatus further includes: cutting the tape by a cutting tool; and using an inclined board below the cutting tool to enable the cut tape to slide.

In some embodiments, the operation method of the semiconductor removing apparatus further includes: moving, by a motor connected to the clamp assembly, the clamp assembly back and forth at the first and second sides of the stage.

In the aforementioned embodiments of the present disclosure, since the clamp assembly can clamp the tape of the tape roll and move above the stage, the clamp assembly may pull the tape from the first side of the stage to the second side of the stage, such that the tape is attached to the cap of the semiconductor structure. As a result, when the clamp assembly pulls the tape from the second side of the stage back to the first side of the stage, the diced portion of the cap may separate from the semiconductor structure. Such a configuration can not only save the time for removing the diced portion of the semiconductor structure, but also reduce the risk of injuring an operator by blowing out the diced portion with a traditional air spray gun, and also avoid dust particles caused by the traditional air spray gun to the working environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
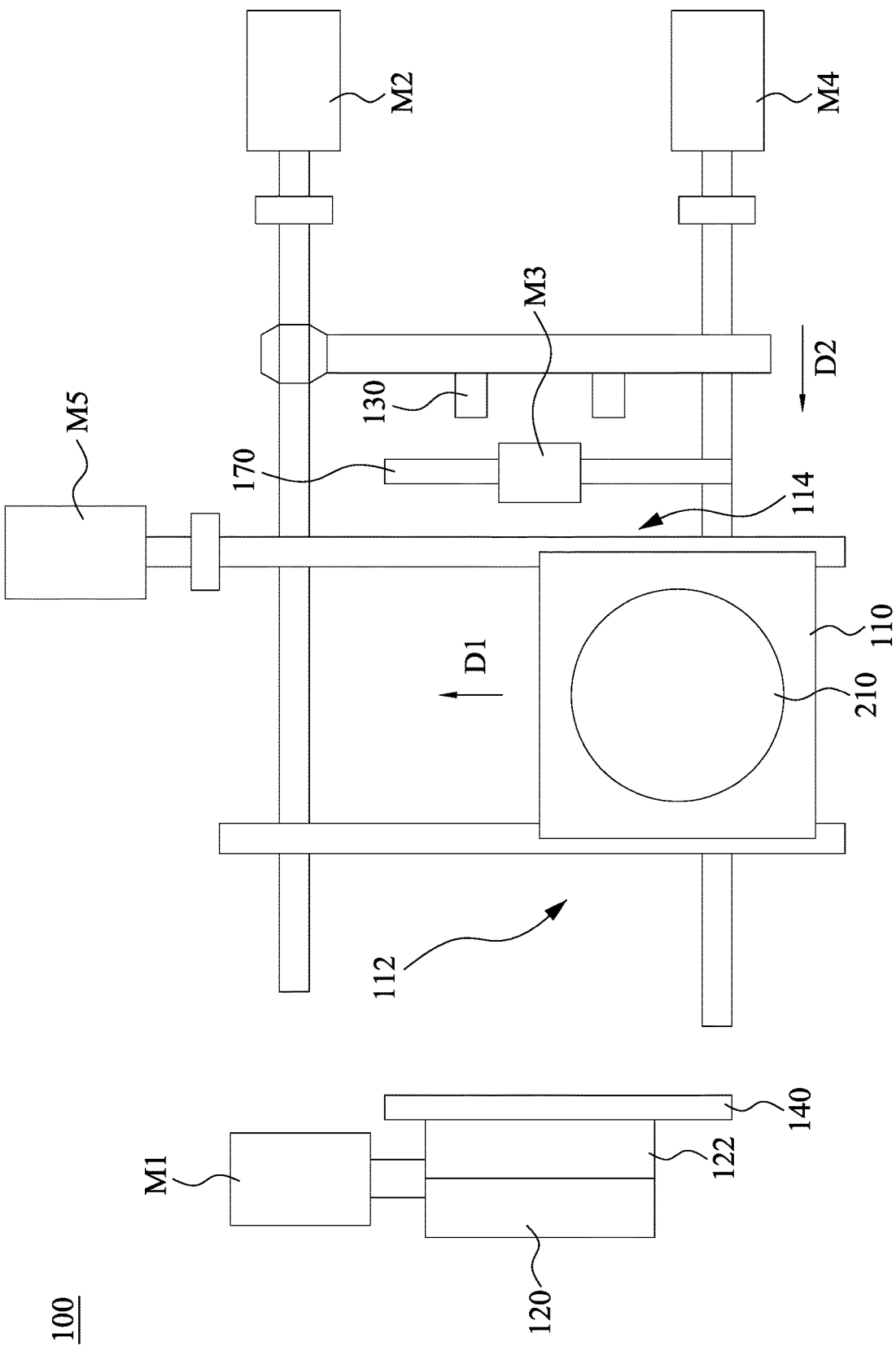
FIGS. 1 to 7 are top views at various steps of an operation method of a semiconductor removing apparatus according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 7 are top views at various steps of an operation method of a semiconductor removing apparatus 100 according to one embodiment of the present disclosure. As shown in FIG. 1, the semiconductor removing apparatus 100 includes a stage 110, a tape roll movably 120, and a clamp assembly 130. The stage 110 is configured to position a semiconductor structure 210. The tape roll 120 is movably located at a first side 112 (e.g., left side) of the stage 110. The clamp assembly 130 is movably located above the stage 110. The semiconductor structure 210 may move to the stage 110. For example, the semiconductor structure 210 is placed on the semiconductor structure 210 by manpower or a robotic arm, and the present disclosure is not limited in this regard. After the semiconductor structure 210 is located on the stage 110, the stage 110 can move in a direction D1 to a position to be attached to a (adhesive) tape 122.

In addition, the semiconductor removing apparatus 100 further includes a cutting tool 140 and a roller assembly 170. The cutting tool 140 is located at the first side 112 of the stage 110 and configured to cut the tape 122. The roller assembly 170 is movably located above the stage 110 and between the tape roll 120 and the clamp assembly 130. The roller assembly 170 may move along with the clamp assembly 130. The semiconductor removing apparatus 100 includes motors M1, M2, M3, M4, and M5. The motor M1 is connected to the tape roll 120 to rotate the tape roll 120. The motor M2 is connected to the clamp assembly 130 to enable the clamp assembly 130 moves back and forth at the first and second sides 112 and 114 of the stage 110. The motors M3 and M4 are connected to the roller assembly 170. The motor M3 may move the roller assembly 170 above the stage 110 in a vertical direction, while the motor M4 may move the roller assembly 170 back and forth at the first and second sides 112 and 114 of the stage 110. The motor M5 is connected to the stage 110 such that the stage 110 may move in the direction D1 and the opposite direction.

Figure 2:
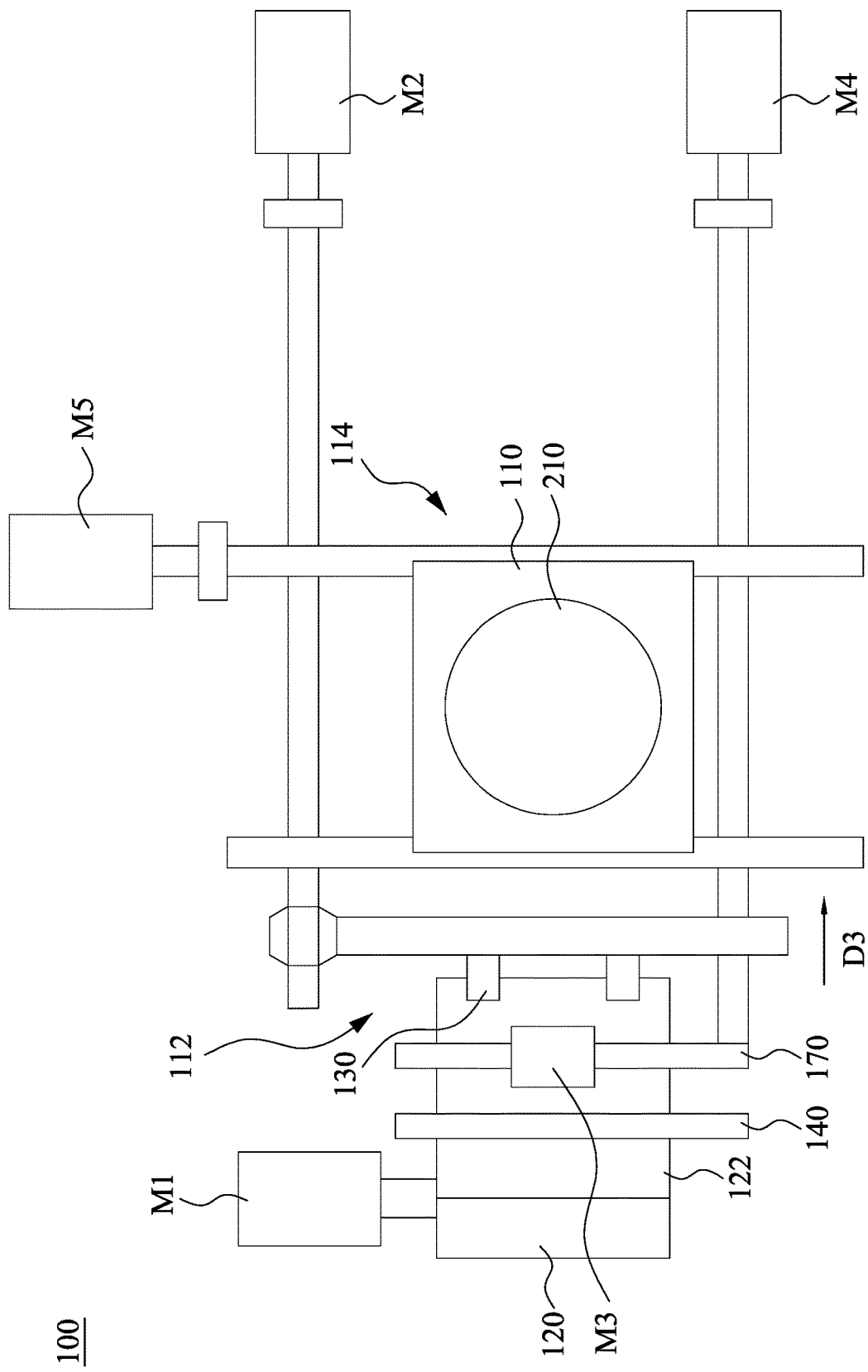

As shown in FIG. 1 and FIG. 2, after the stage 110 moves to a position to be attached to the tape 122 in the direction D1, the clamp assembly 130 may move to the first side 112 of the stage 110 in a direction D2 to clamp the tape 122 of the tape roll 120. The roller assembly 170 may move to the first side 112 of the stage 110 along with the clamp assembly 130 in the direction D2. The roller assembly 170 is maintained between the clamp assembly 130 and the tape roll 120.

Figure 3:
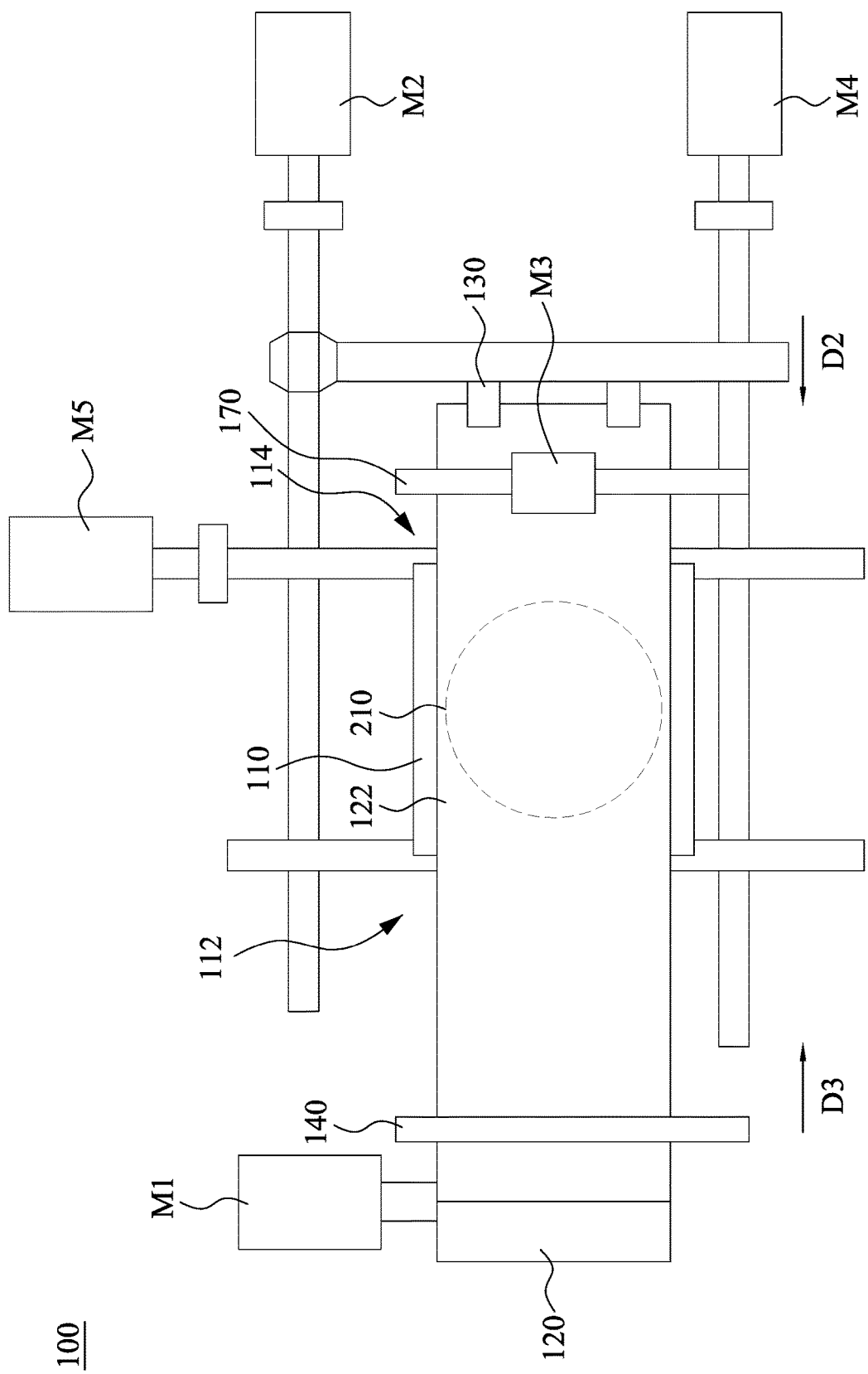
Figure 4:
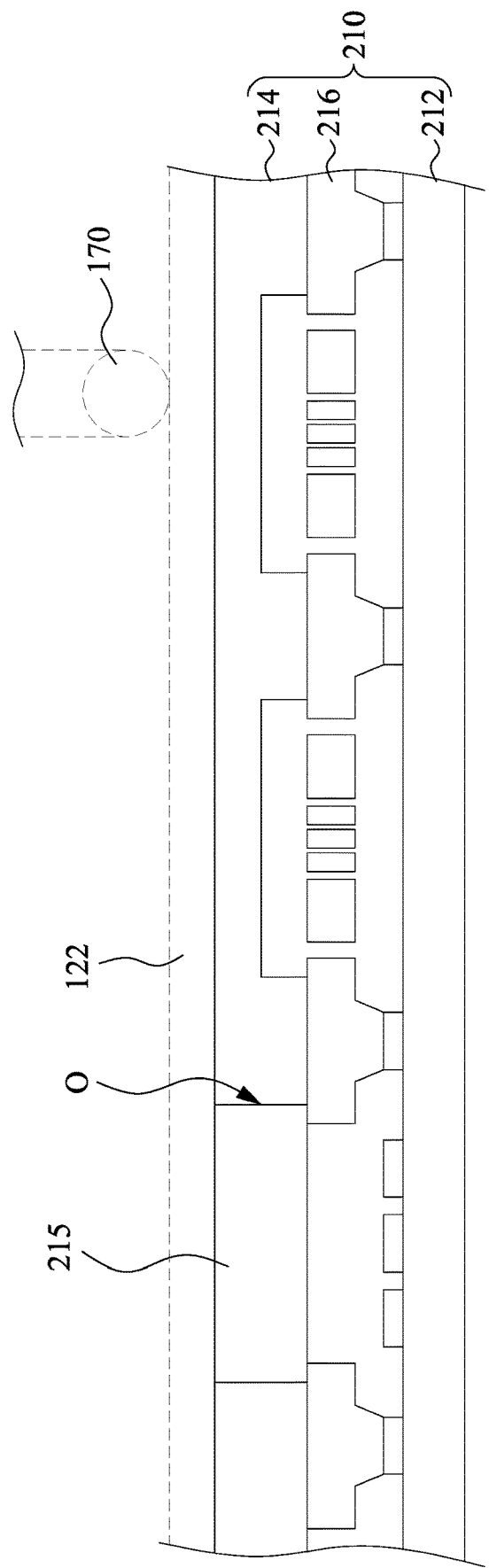

As shown in FIG. 3 and FIG. 4, thereafter, the clamp assembly 130 is configured to pull the tape 122 of the tape roll 120 from the first side 112 of the stage 110 to the second side 114 of the stage 110, such that the tape 122 is attached to the semiconductor structure 210. The semiconductor structure 210 includes a lower substrate 212, a cap 214, and a micro electro mechanical system (MEMS) structure 216 between the lower substrate 212 and the cap 214. The cap 214 may be a silicon cap (Si cap). Furthermore, the cap 214 has a diced portion 215 to be removed. The diced portion 215 of the cap 214 covers a conductive pad of the lower substrate 212. The tape 122 is attached to the cap 214 of the semiconductor structure 210 through the clamp assembly 130.

In this embodiment, when the clamp assembly 130 moves in a direction D3, the roller assembly 170 also moves in the direction D3 and moves (downwardly) toward the semiconductor structure 210 to abut against the tape 122, thereby ensuring a portion of the tape 122 overlapping the semiconductor structure 210 to attach to the cap 214.

Figure 5:
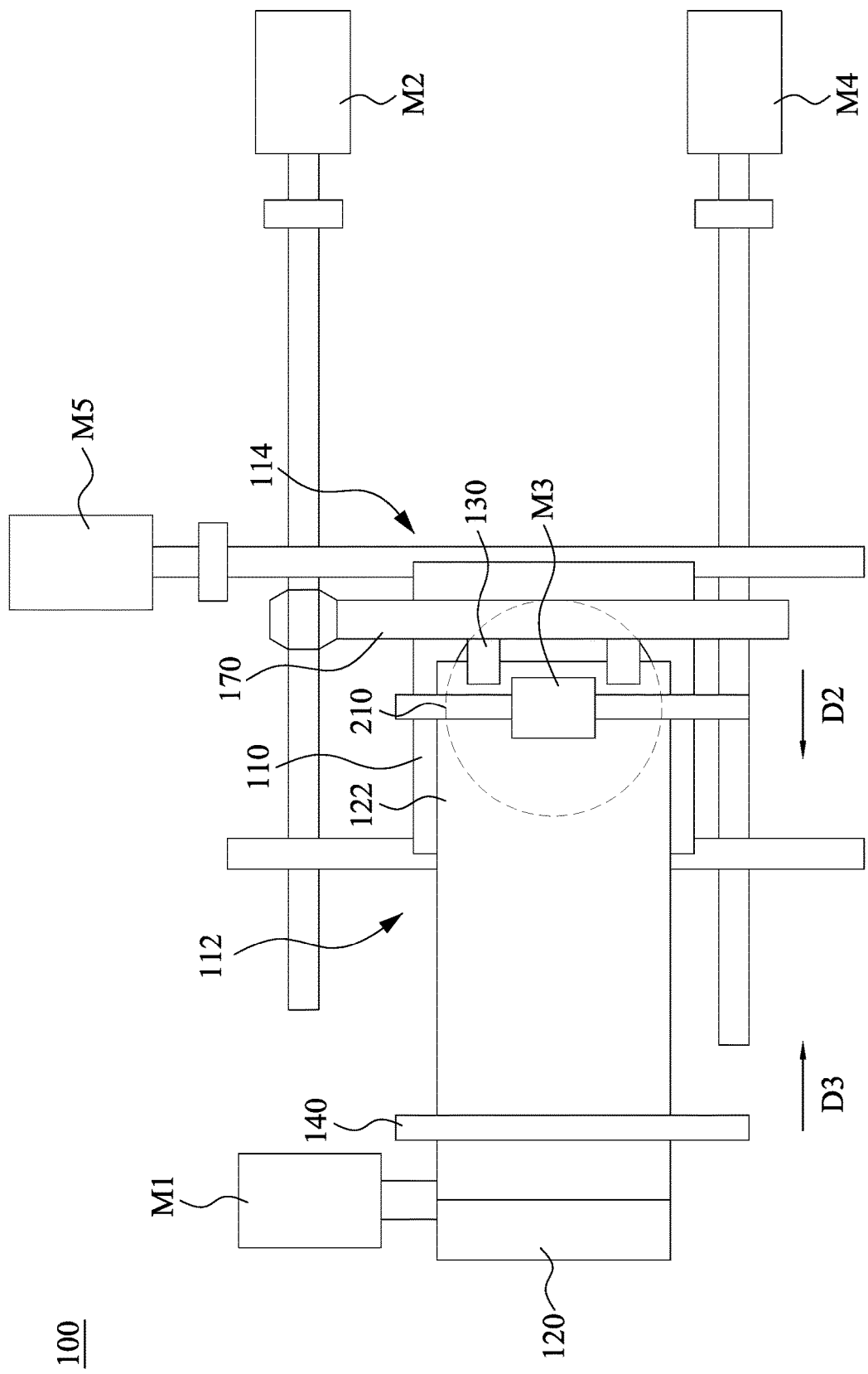
Figure 6:
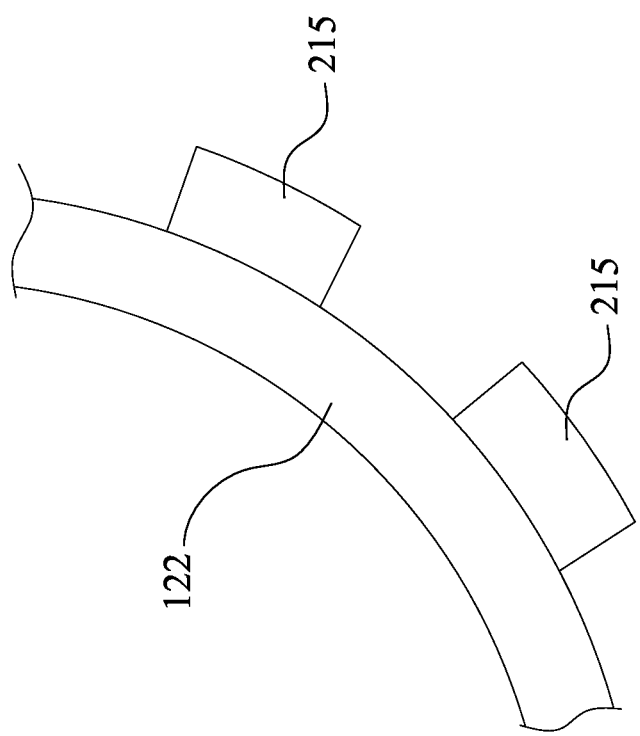

As shown in FIG. 5 and FIG. 6, after the tape 122 attached to the semiconductor structure 210, the clamp assembly 130 may pull the tape 122 from the second side 114 of the stage 110 back to the first side 112 of the stage 110 (i.e., in the direction D2), such that the diced portion 215 of the cap 214 separates from the semiconductor structure 210. As a result, a conductive pad of the lower substrate 212 may be exposed through an opening O of the cap 214 (see FIG. 4) to facilitate bonding to other electronic components.

In this embodiment, when the clamp assembly 130 moves in the direction D2, the roller assembly 170 also moves in the direction D2. At this time, the roller assembly 170 may not abut against the tape 122 such that the roller assembly 170 and the tape 122 are separated from each other.

Figure 7:
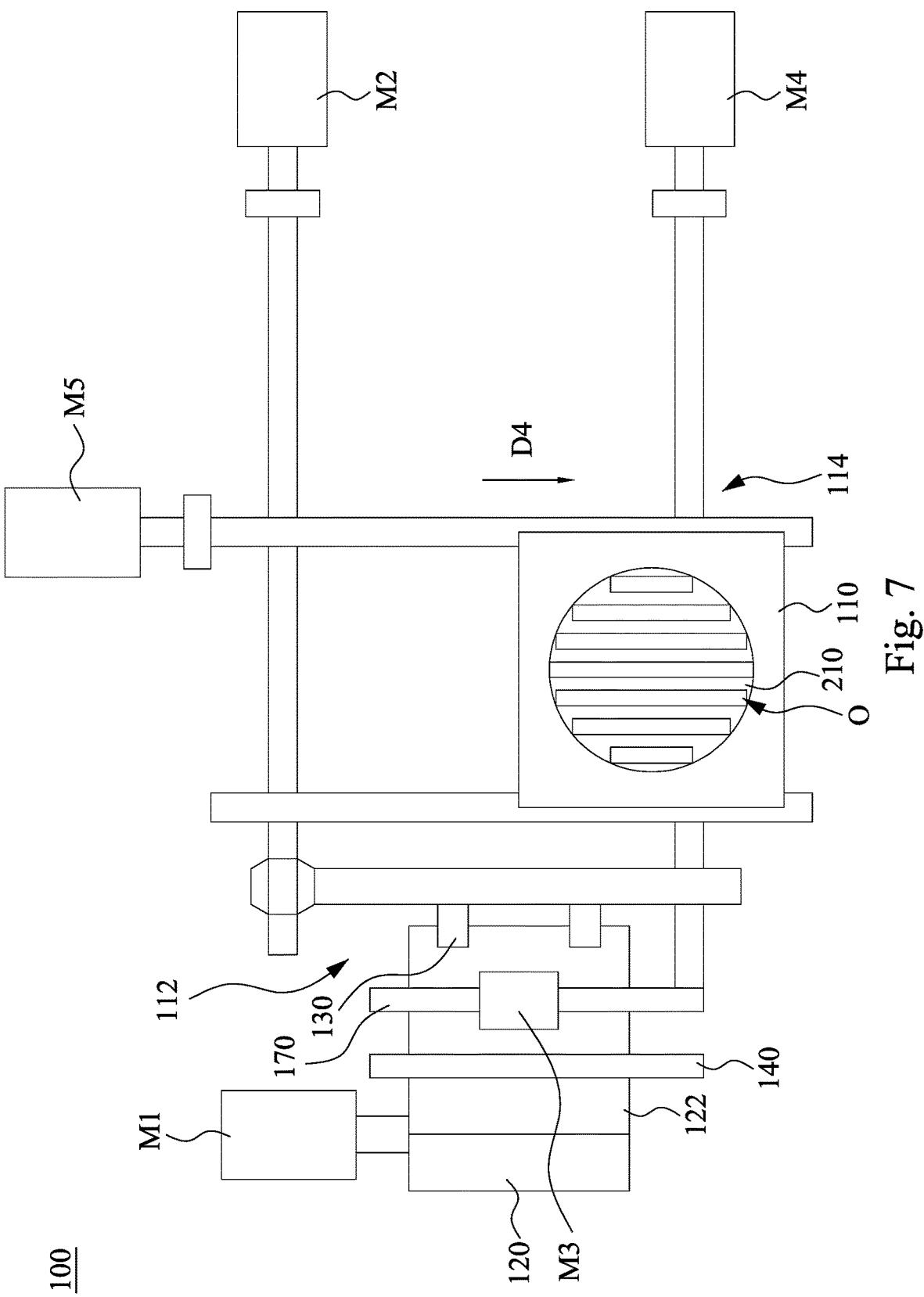

As shown in FIG. 7, thereafter, the stage 110 may move to a position where the semiconductor structure 210 is placed, and said position can also be a position when the semiconductor structure 210 is taken out. For example, the semiconductor structure 210 can be taken out by manpower or a robotic arm, and the present disclosure is not limited in this regard. Moreover, after pulling the tape 122 from the second side 114 of the stage 110 back to the first side 112 of the stage 114, the cutting tool 140 may be used to cut the tape 122 attaching the diced portion 215.

Figure 8:
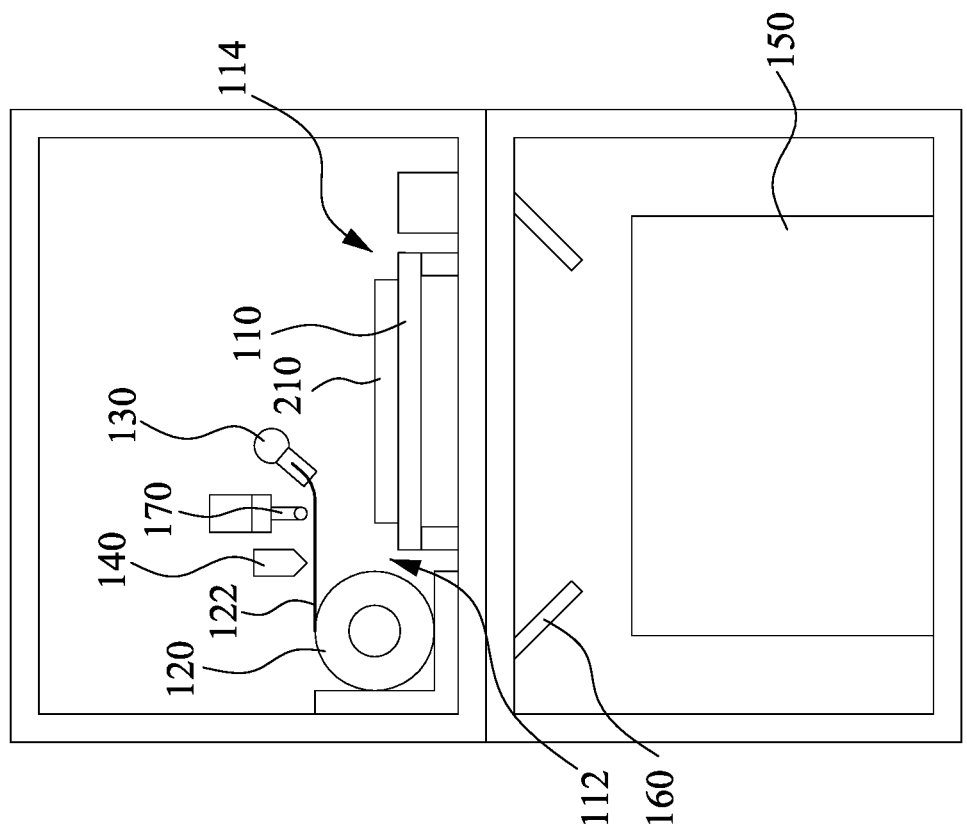
FIG. 8 is a side view of the semiconductor removing apparatus of FIG. 7.

FIG. 8 is a side view of the semiconductor removing apparatus 100 of FIG. 7. As shown on FIG. 7 and FIG. 8, the semiconductor removing apparatus 100 further includes an accommodating box 150. The accommodating box 150 is located below the stage 110. After the tape 122 is cut by the cutting tool 140, the accommodating box 150 below the stage 110 may receive the tape 122 cut by the cutting tool 140. In this embodiment, the semiconductor removing apparatus 100 further includes an inclined board 160. The inclined board 160 is located below the cutting tool 140 and extends toward the accommodating box 150, which facilitates the cut tape 122 to slide into the accommodating box 150 along the inclined board 160.

Referring back to FIG. 3 and FIG. 4, since the clamp assembly 130 can clamp the tape 122 of the tape roll 120 and move above the stage 110, the clamp assembly 130 may pull the tape 122 of the tape roll 120 from the first side 112 of the stage 110 to the second side 114 of the stage 110, such that the tape 122 is attached to the cap 214 of the semiconductor structure 210. As a result, when the clamp assembly 130 pulls the tape 122 from the second side 114 of the stage 110 back to the first side 112 of the stage 110, the diced portion 215 of the cap 214 may separate from the semiconductor structure 210. Such a configuration can not only save the time for removing the diced portion 215 of the semiconductor structure 210, but also reduce the risk of injuring an operator by blowing out the diced portion 215 with a traditional air spray gun, and also avoid dust particles caused by the traditional air spray gun to the working environment.

It is to be noted that the connection relationships, the materials, and the advantages of the elements described above will not be repeated in the following description.

Figure 9:
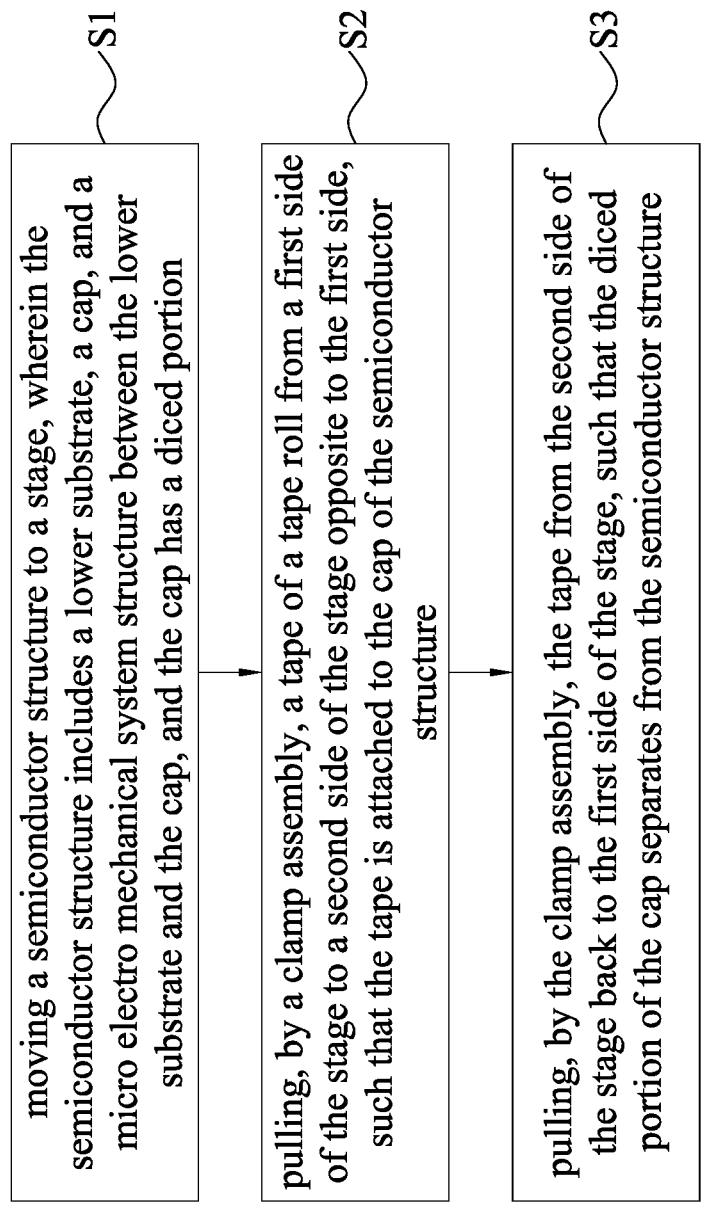
FIG. 9 is a flow chart of an operation method of a semiconductor removing apparatus according to one embodiment of the present disclosure.

FIG. 9 is a flow chart of an operation method of a semiconductor removing apparatus according to one embodiment of the present disclosure. The operation method of the semiconductor removing apparatus includes the following steps. In step S1, moving a semiconductor structure to a stage, wherein the semiconductor structure includes a lower substrate, a cap, and a micro electro mechanical system structure between the lower substrate and the cap, and the cap has a diced portion. Next, in step S2, pulling, by a clamp assembly, a tape of a tape roll from a first side of the stage to a second side of the stage opposite to the first side, such that the tape is attached to the cap of the semiconductor structure. Thereafter, in step S3, pulling, by the clamp assembly, the tape from the second side of the stage back to the first side of the stage, such that the diced portion of the cap separates from the semiconductor structure.

The operation method of the semiconductor removing apparatus further includes: after pulling the tape from the second side of the stage back to the first side of the stage, cutting the tape by a cutting tool. In addition, after cutting the tape, receiving, by an accommodating box located below the stage, the tape that is cut by the cutting tool.

Moreover, when the clamp assembly pulls the tape from the first side of the stage to the second side of the stage, a roller assembly located above the stage may be used to abut against the tape, wherein the roller assembly is located between the tape roll and the clamp assembly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor removing apparatus, comprising:
   a stage configured to position a semiconductor structure, wherein the semiconductor structure includes a lower substrate, a cap, and a micro electro mechanical system (MEMS) structure between the lower substrate and the cap, and the cap has a diced portion;
   a tape roll movably located at a first side of the stage; and
   a clamp assembly movably located above the stage, configured to pull a tape of the tape roll from the first side of the stage to a second side of the stage opposite to the first side such that the tape is attached to the cap of the semiconductor structure, and configured to pull the tape of the tape roll from the second side of the stage back to the first side of the stage such that the diced portion of the cap separates from the semiconductor structure.

2. The semiconductor removing apparatus of claim 1, further comprising:
   a cutting tool located at the first side of the stage and configured to cut the tape.

3. The semiconductor removing apparatus of claim 2, further comprising:
   an accommodating box located below the stage and configured to receive the cut tape.

4. The semiconductor removing apparatus of claim 3, further comprising:
   an inclined board located below the cutting tool and extending toward the accommodating box.

5. The semiconductor removing apparatus of claim 1, further comprising:
   a motor connected to the tape roll.

6. The semiconductor removing apparatus of claim 1, further comprising:
   a motor connected to the clamp assembly.

7. The semiconductor removing apparatus of claim 1, further comprising:
   a roller assembly movably located above the stage and between the tape roll and the clamp assembly.

8. The semiconductor removing apparatus of claim 7, further comprising:
   a motor connected to the roller assembly.

9. An operation method of a semiconductor removing apparatus, comprising:
   moving a semiconductor structure to a stage, wherein the semiconductor structure includes a lower substrate, a cap, and a micro electro mechanical system (MEMS) structure between the lower substrate and the cap, and the cap has a diced portion;
   pulling, by a clamp assembly, a tape of a tape roll from a first side of the stage to a second side of the stage opposite to the first side, such that the tape is attached to the cap of the semiconductor structure; and
   pulling, by the clamp assembly, the tape from the second side of the stage back to the first side of the stage, such that the diced portion of the cap separates from the semiconductor structure.

10. The operation method of the semiconductor removing apparatus of claim 9, further comprising:

after pulling the tape from the second side of the stage back to the first side of the stage, cutting the tape by a cutting tool.

11. The operation method of the semiconductor removing apparatus of claim 10, further comprising:
after cutting the tape, receiving, by an accommodating box located below the stage, the tape that is cut by the cutting tool.

12. The operation method of the semiconductor removing apparatus of claim 9, further comprising:
using a roller assembly located above the stage to abut against the tape, wherein the roller assembly is located between the tape roll and the clamp assembly.

13. The operation method of the semiconductor removing apparatus of claim 12, wherein using the roller assembly to abut against the tape is performed such that the tape is attached to the semiconductor structure.

14. The operation method of the semiconductor removing apparatus of claim 9, further comprising:
cutting the tape by a cutting tool; and
using an inclined board below the cutting tool to enable the cut tape to slide.

15. The operation method of the semiconductor removing apparatus of claim 9, further comprising:
moving, by a motor connected to the clamp assembly, the clamp assembly back and forth at the first and second sides of the stage.

* * * * *